United States Patent
An

(10) Patent No.: US 8,605,522 B2
(45) Date of Patent: Dec. 10, 2013

(54) SEMICONDUCTOR MEMORY APPARATUS, AND SUCCESSIVE PROGRAM CONTROL CIRCUIT AND PROGRAM METHOD THEREFOR

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/445,626

(22) Filed: Apr. 12, 2012

(65) Prior Publication Data

US 2013/0114357 A1    May 9, 2013

(30) Foreign Application Priority Data

Nov. 4, 2011  (KR) .................. 10-2011-0114428

(51) Int. Cl.
  *G11C 7/00*    (2006.01)
(52) U.S. Cl.
  USPC ...... 365/191; 365/148; 365/163; 365/185.23; 365/189.16
(58) Field of Classification Search
  USPC ...................................... 365/100
  See application file for complete search history.

(56) References Cited

U.S. PATENT DOCUMENTS

| | | | | |
|---|---|---|---|---|
| 5,532,964 A | * | 7/1996 | Cernea et al. | 365/189.09 |
| 6,044,013 A | * | 3/2000 | Tanaka et al. | 365/185.03 |
| 7,580,322 B2 | * | 8/2009 | Im | 365/236 |
| 7,590,795 B2 | | 9/2009 | Sinclair et al. | |
| 7,643,340 B2 | * | 1/2010 | Kong et al. | 365/185.03 |
| 8,094,500 B2 | | 1/2012 | Paley et al. | |
| 2013/0114356 A1 | * | 5/2013 | An | 365/191 |

FOREIGN PATENT DOCUMENTS

KR   1020100007714 A   1/2010

* cited by examiner

*Primary Examiner* — Tan T. Nguyen
(74) *Attorney, Agent, or Firm* — William Park & Associates Patent Ltd.

(57) ABSTRACT

A semiconductor memory apparatus includes a program pulse generation block configured to generate write control signals and a program completion signal in response to a programming enable signal; a successive program control circuit configured to generate a successive programming enable signal in response to received program addresses and data count signals as a buffered program command or a buffered overwrite command; and a controller configured to generate the programming enable signal in response to the successive programming enable signal.

29 Claims, 16 Drawing Sheets

SEMICONDUCTOR MEMORY APPARATUS, AND SUCCESSIVE PROGRAM CONTROL CIRCUIT AND PROGRAM METHOD THEREFOR

CROSS-REFERENCES TO RELATED APPLICATION

The present application claims priority under 35 U.S.C. §119(a) to Korean application number 10-2011-0114428, filed on Nov. 4, 2011, in the Korean Intellectual Property Office, which is incorporated herein by reference in its entirety.

BACKGROUND

1. Technical Field

The present invention relates to a semiconductor system, and more particularly, to a semiconductor memory apparatus, and a is successive program control circuit and a program method therefor.

2. Related Art

A PCRAM (phase change RAM) is a memory apparatus which uses the phase change characteristic of a specified substance constituting a memory cell. A phase change substance may be converted into an amorphous state or a crystalline state depending upon a temperature condition, and may include, for example, a chalcogenide-based alloy. A representative phase change substance includes a Ge2Sb2Te5 (hereafter referred to as a 'GST') substance which uses germanium, antimony and tellurium.

Most substances have different melting points and crystallization temperatures, and their degree of crystallization may vary depending upon a cooling time and a cooling temperature. This may serve as a unique characteristic of a substance. In particular, a GST substance may be more clearly distinguished between the amorphous state and the crystalline state than other substances.

FIG. 1 is a graph for explaining phase changes of a general phase change substance depending upon a temperature. A GST substance will be used as an example.

When GST is applied with a high temperature equal to or greater than the melting point of GST for a predetermined time (several tens to several hundreds nanoseconds [ns]) and is quenched for a preset time Tq, the amorphous state of the GST is maintained as it is, and a resistance value becomes several hundreds kilohms (kΩ) to several megohms (MΩ).

Also, if the GST is maintained at a crystallization temperature for a preselected time (several hundreds ns to several microseconds [μs]) and is then cooled, the GST is converted into the crystalline state and the resistance value becomes several kΩ to several tens kΩ. As a time for maintaining the crystallization temperature is lengthened, the crystalline state improves and accordingly, the GST has a smaller resistance value.

FIG. 2 is another graph for explaining phase changes of the general phase change substance depending upon a temperature. Similarly, the GST substance will be used as an example.

FIG. 2 shows an example in which the GST is crystallized by applying a temperature near the melting point of GST for a predetermined time, and slowly cooling the GST. Even in this case, the resistance value of the GST becomes several kΩ to several tens kΩ, and as a cooling time is lengthened, the crystalline state improves. Also, a crystallization time is shortened when compared to FIG. 1.

In order to use such a characteristic of the GST, heat may be directly applied to the GST; or Joule's heat may be electrically generated by current flow through a conductor or a semiconductor to convert the GST between the amorphous state and the crystalline state.

While FIGS. 1 and 2 show general operations of the phase change memory apparatus, the method of FIG. 2 is mainly used since a set data program time, that is, a time required for crystallizing the GST is short.

FIG. 3 is a configuration diagram of a cell array of a conventional phase change memory apparatus.

Referring to FIG. 3, each memory cell MC is constituted by a phase change substance GST and a switching element which are connected between a word line WL and a bit line BL.

Program operations of a phase change memory apparatus will be described below with reference to FIG. 4.

FIG. 4 is a configuration diagram of a conventional phase change memory apparatus.

Referring to FIG. 4, a phase change memory apparatus 1 includes a program pulse generation block 11, a write driver 12, and a memory block 13.

The program pulse generation block 11 is configured to generate a first write control signal RESETEN and second write control signals SETP<0:n> in response to a programming enable signal PGMP. The program pulse generation block 11 provides the first write control signal RESETEN and the second write control signals SETP<0:n> to the write driver 12. Further, when the operation of generating the first write control signal RESETEN and the second write control signals SETP<0:n> is completed, the program pulse generation block 11 generates a program completion signal PGMNDP and transmits the program completion signal PGMNDP to a controller.

The write driver 12 is configured to be driven in response to a write enable signal WDEN. The write driver 12 is provided with the first write control signal RESETEN and the second write control signals SETP<0:n>, and provides program current I_PGM to the memory block 13 in response to data DATA to be programmed and bit line select switch control signals YSW<0:m>.

Accordingly, in the memory block 13, as the resistant state of a GST is changed depending upon the level of the data DATA to be programmed, the data DATA can be recorded.

FIG. 5 is a block diagram showing an example of the program pulse generation block shown in FIG. 4.

Referring to FIG. 5, the program pulse generation block 11 is configured to include an initial pulse generation unit 111, a reset pulse generation unit 113, and a quenching pulse generation unit 115.

The initial pulse generation unit 111 is configured to generate a period setting signal QSSETP in response to the programming enable signal PGMP which is provided from the controller. The period setting signal QSSETP is a signal which determines a time to supply heat near a melting point to the GST. The initial pulse generation unit 111 enables the period setting signal QSSETP after counting a preset time in response to the programming enable signal PGMP.

The reset pulse generation unit 113 is configured to generate the first write control signal RESETEN in response to the programming enable signal PGMP and a reset signal IRSTP which is generated by delaying the period setting signal QSSETP by a predefined time.

The quenching pulse generation unit 115 is configured to generate the second write control signals SETP<0:n> which have different enable periods, in response to the programming enable signal PGMP and the period setting signal QSSETP. Further, the quenching pulse generation unit 115 generates a program completion signal PGMNDP when the generation of the second write control signals SETP<0:n> is completed.

According to such a configuration, the reset pulse generation unit 113 generates the first write control signal RESETEN during a period from after the programming enable signal PGMP is enabled to when the reset signal IRSTP is enabled. The quenching pulse generation unit 115 enables the second write control signals SETP<0:n> at the same levels until the period setting signal QSSETP is enabled, and generates the second write control signals SETP<0:n> after the period setting signal QSSETP is generated.

FIG. 6 is a timing diagram explaining program operations of the conventional phase change memory apparatus.

As a program command PGM is applied, the programming enable signal PGMP is generated from the controller. Accordingly, the initial pulse generation unit 111 operates and generates an internal clock enable signal IPWEN. Then, after an internal clock ICK is generated, counting codes Q<0:3> are generated by counting the preset time, and when the counting is completed, the period setting signal QSSETP is generated.

The reset pulse generation unit 113 enables the first write control signal RESETEN in response to the programming enable signal PGMP, and disables the first write control signal RESETEN as the reset signal IRSTP is enabled. The reset signal IRSTP is generated by delaying the period setting signal QSSETP by the predefined time. During a period in which the first write control signal RESETEN is enabled, programming current is generated from the write driver 12 and is provided to a bit line BL0.

The quenching pulse generation unit 115 generates a count enable signal CKEN (CNTENB) and an internal clock QSCK in response to the period setting signal QSSETP. Accordingly, the second write control signals SETP<0:3> which have different enable periods are generated. When generation of the second write control signal SETP<0:3> is completed, a quenching pulse completion signal QSND is disabled, and then, when a reset signal QSRSTP is enabled, the program completion signal PGMNDP is outputted. In this case, the current driving force of the write driver 12 is sequentially damped according to the enable periods of the second write control signals SETP<0:3>, and a quenching pulse is provided to the GST.

In a program operation, a word line maintains a high potential (equal to or greater than VCC) when a word line select switch is in a disabled state, and is discharged to the level of a ground voltage as the word line select switch is enabled. A current path is formed via a bit line that is selected by the write driver 12. The current path may be formed by the write driver 12 through a bit line select switch, the bit line, a switching element and the GST to the word line.

When the current path is formed in this way, the amount of current driven by the write driver 12 is determined according to the first write control signal RESETEN or the second write control signals SETP<0:n> depending upon a data level (0/1) to be programmed, and the program current is provided to the memory cell through the bit line. For example, when assuming that an amount of current provided by the first write control signal RESETEN is 100%, an amount of current provided to the memory cell when all of the second write control signals SETP<0:3> are enabled is controlled to a rate of 30 to 90%.

In the program operation, the current provided through the bit line is provided in a rectangular type in the case of reset data. In the case of set data, the current is provided initially in a type similar to a rectangular type but is then provided by being reduced into a step type by the second write control signals SETP<0:n>.

In a semiconductor memory apparatus, in order to improve program efficiency, a number of data should be successively programmed, and to this end, a program command and data should be repeatedly received from an outside source. In this regard, since a time required for program includes not only an actual program time but also a time for receiving the program command and the data, if the program command and the data are repeatedly received, the entire program time becomes long.

SUMMARY

In one embodiment of the present invention, a semiconductor memory apparatus includes: a program pulse generation block configured to generate write control signals and a program completion signal in response to a programming enable signal; a successive program control circuit configured to generate a successive programming enable signal in response to received program addresses and data count signals as a buffered program command or a buffered overwrite command; and a controller configured to generate the programming enable signal in response to the successive programming enable signal.

In another embodiment of the present invention, a semiconductor memory apparatus includes: a program pulse generation block configured to generate and output write control signals according to a programming enable signal which is generated in response to a successive programming enable signal, where the successive programming enable signal is generated in response to program addresses and data count signals; and a write driver configured to provide a program pulse generated in response to the write control signals, to a memory block.

In another embodiment of the present invention, a successive program control circuit is connected with a program pulse generation block which generates a program completion signal in response to a programming enable signal which is generated is according to a successive programming enable signal, and the successive program control circuit sets the number of successive program times according to program addresses and data count signals, and generates the successive programming enable signal according to the number of successive program times.

In another embodiment of the present invention, a program method for a semiconductor memory apparatus includes: inputting data to a semiconductor memory apparatus having a program pulse generation block; determining, by the program pulse generation block, the number of successive program times according to program addresses and data count signals; repeatedly generating a programming enable signal, by the program pulse generation block, in correspondence to the number of successive program times; and programming the data to a selected region of a memory block by a write driver, in response to the programming enable signal.

BRIEF DESCRIPTION OF THE DRAWINGS

Features, aspects, and embodiments are described in conjunction with the attached drawings, in which.

DETAILED DESCRIPTION

In standards for a semiconductor memory apparatus, in particular, a nonvolatile semiconductor memory apparatus, recording of reset data is defined as a program operation. In particular, a programming operation using units of 16 bits is defined as a single word program, and a programming operation using units of 512 bytes (256 words) is defined as a buffered program. Also, recording using is units of 128 KB of set data is defined as an erase operation, and simultaneous recording of reset data and set data is defined as overwrite. Further, simultaneous recording of set/reset data by the unit of 16 bits is defined as single word overwrite, and simultaneous recording of set/reset data using units of 512 bytes (256 words) is defined as buffered overwrite.

An embodiment of the present invention includes a semiconductor memory apparatus capable of successive program operations without repeatedly receiving a program command and data to improve program performance. According to this fact, a buffer program operation and a buffered overwrite operation for simultaneous recording of a number of data may be performed.

To this end, based on nonvolatile memory apparatus standards, signals (an address, a data count meaning the word number of data to be programmed, program data corresponding to the data count, command codes, etc.) necessary for a successive program operation are temporarily stored in a register, and as command execution codes are enabled, the successive program command (and/or operation), that is, the buffered program command (and/or operation) or the buffered overwrite operation is performed using the signals stored in the register.

Hereinafter, a semiconductor memory apparatus, and a successive program control circuit and a program method therefor according to embodiments of the present invention will be described below with reference to the accompanying drawings.

Figure 1:
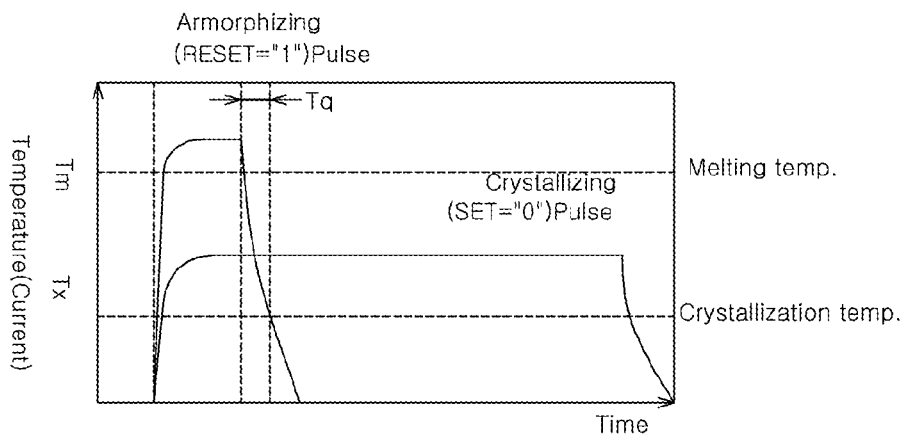
FIG. 1 is a graph illustrating phase changes of a general phase change substance depending upon a temperature.
Figure 2:
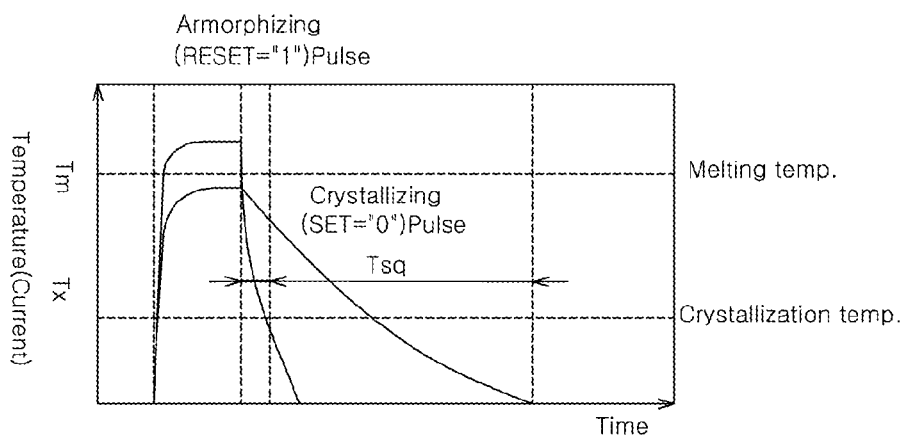
FIG. 2 is another graph illustrating phase changes of the general phase change substance depending upon a temperature.
Figure 3:
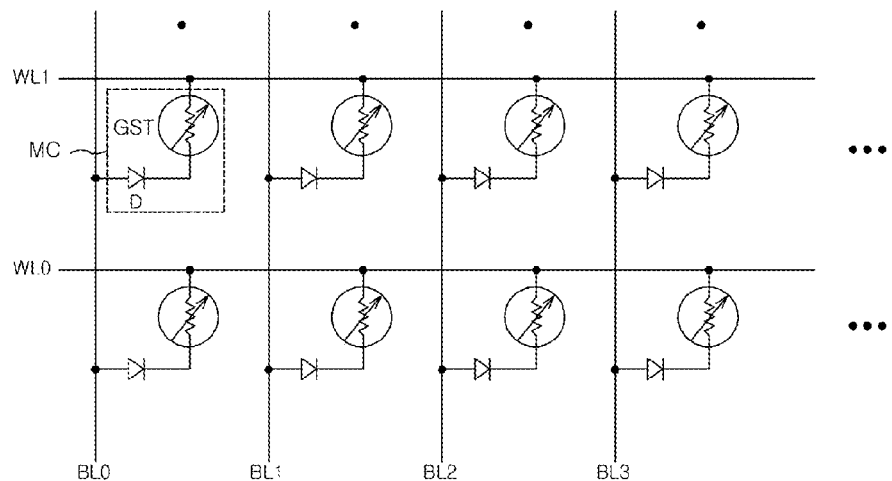
FIG. 3 illustrates a configuration diagram of a cell array of a conventional phase change memory apparatus.
Figure 4:
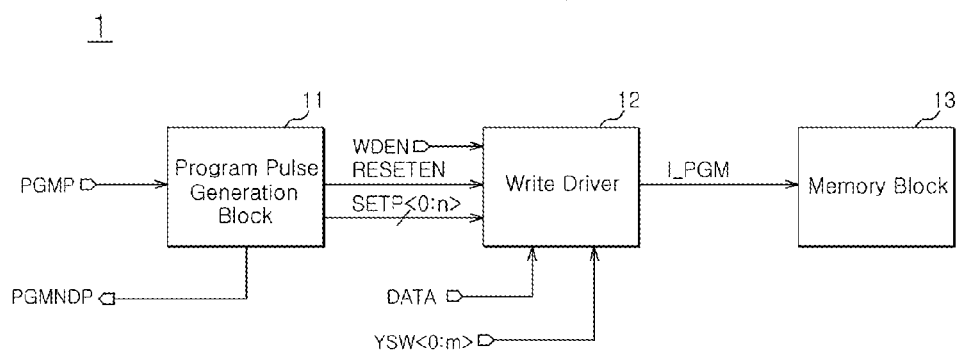
FIG. 4 illustrates a configuration diagram of a conventional phase change memory apparatus.
Figure 5:
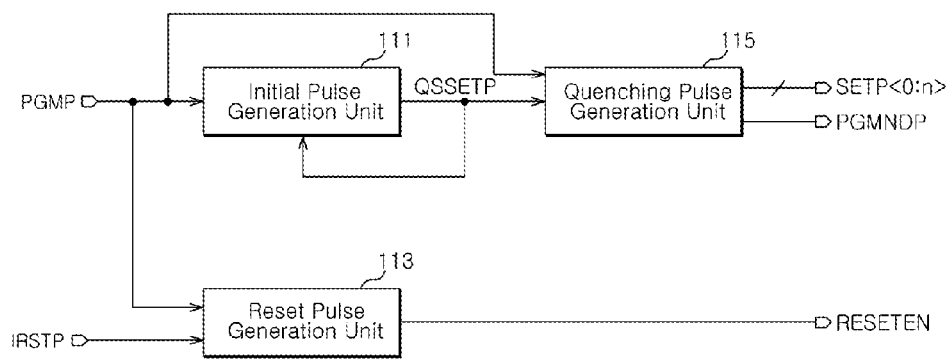
FIG. 5 is a block diagram exemplifying a program pulse generation block shown in FIG. 4.
Figure 6:
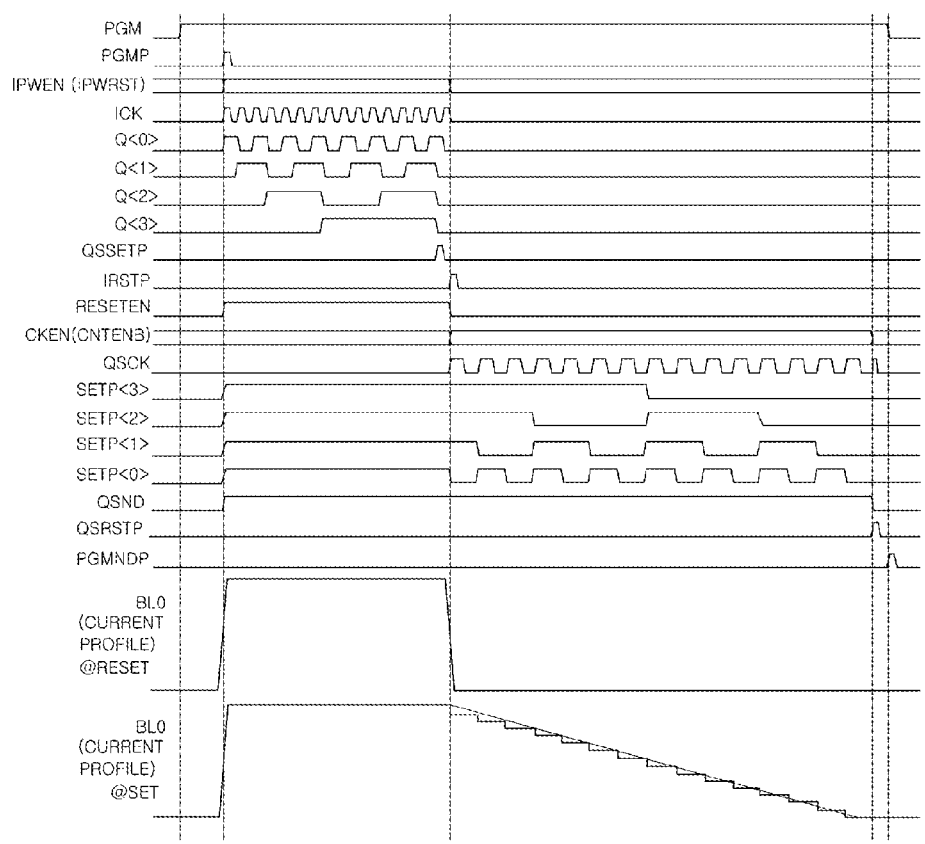
FIG. 6 is a timing diagram explaining program operations of the conventional phase change memory apparatus.
Figure 7:
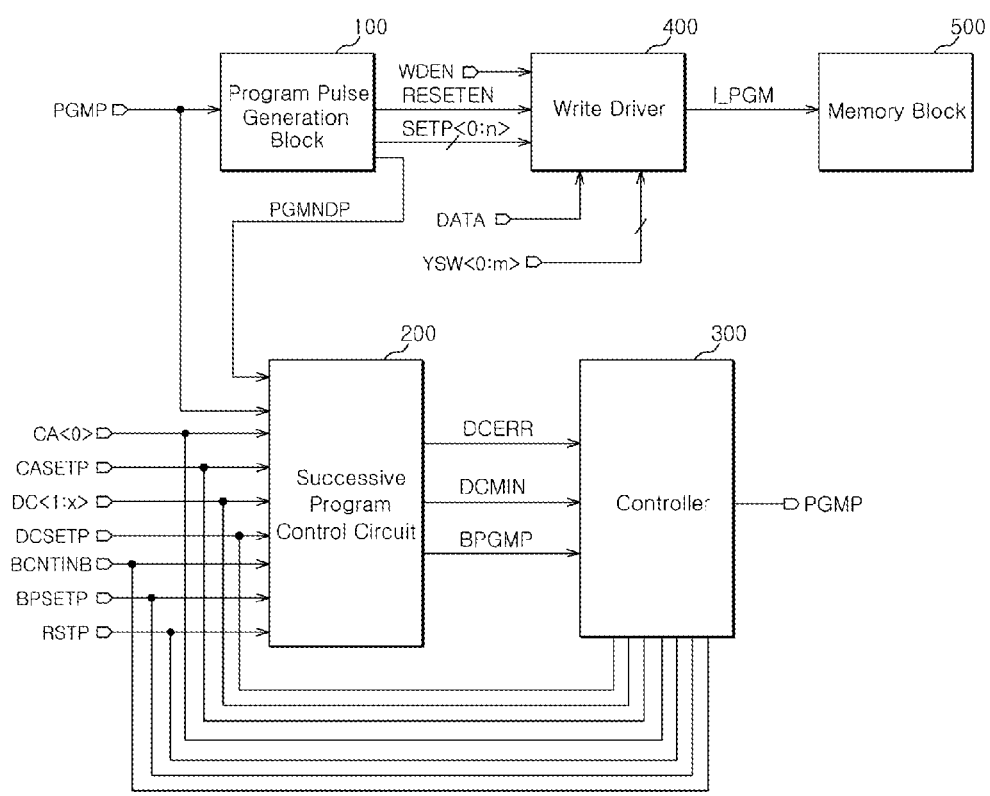
FIG. 7 is a configuration diagram of a semiconductor memory apparatus in accordance with an embodiment of the present invention.

FIG. 7 illustrates a configuration diagram of a semiconductor memory apparatus in accordance with an embodiment of the present invention.

Referring to FIG. 7, a semiconductor memory apparatus 10 may include a program pulse generation block 100, a successive program control circuit 200, a controller 300, a write driver 400 and a memory block 500. The program pulse generation block 100 may be configured to generate a first write control signal RESETEN and second write control signals SETP<0:n> in response to a programming enable signal PGMP. The successive program control circuit 200 may be configured to generate a successive programming enable signal BPGMP in response to a program address(es) and data count signals received from an outside source. The controller 300 may be configured to provide program operation-related control signals including the programming enable signal PGMP, an address and a data signal. The write driver 400 may be configured to generate program current I_PGM for programming input data DATA in response to the write control signals RESETEN and SETP<0:n> (provided from the program pulse generation block 100) and bit line select switch control signals YSW<0:m>. The memory block 500 may include a plurality of memory cells and the memory block 500 may be configured to record data in respective memory cells according to current provided from the write driver 400.

In the semiconductor memory apparatus 10, the successive program control circuit 200 generates the successive is programming enable signal BPGMP for performing successive program commands (and/or operations) a number of program times (in other words, iterations), where the number of program iterations are determined on a basis of a program address CA<0> and data count signals DC<1:x>. The successive program control circuit 200 may also provide the successive programming enable signal BPGMP to the controller 300. The successive program control circuit 200 may provide the successive programming enable signal BPGMP as a buffered program command or a buffered overwrite command.

The controller 300 provides the programming enable signal PGMP generated in response to the successive programming enable signal BPGMP. The controller 300 may provide the programming enable signal PGMP to the program pulse generation block 100 so that a program operation is performed the number of program times determined by the successive program control circuit 200.

In addition, the successive program control circuit 200 may generate an error signal DCERR when a data count value exceeding a maximum number of successive program times is inputted to the successive program control circuit 200. The successive program control circuit 200 may provide the error signal DCERR to the controller 300. Further, if a successive program mode is ended by the program address CA<0> and the data count signals DC<1:x>, the successive program control circuit 200 generates a successive program end signal DCMIN and provides the successive program end signal DCMIN to the controller 300, so that the controller 300 does not generate the programming enable signal PGMP any more.

Operations of the respective component parts of the semiconductor memory apparatus 10 will be described below in detail.

The program pulse generation block 100 generates the first write control signal RESETEN and the second write control signals SETP<0:n> in response to the programming enable signal PGMP. The program pulse generation block 100 provides the first write control signal RESETEN and the second write control signals SETP<0:n> to the write driver 400. Further, when the operation of generating the first write control signal RESETEN and the second write control signals SETP<0:n> is completed, the program pulse generation block 100 generates a program completion signal PGMNDP and transfers the program completion signal PGMNDP to the successive program control circuit 200. In an embodiment, if a program operation is completed one time by the first and second write control signals RESETEN and SETP<0:n>, the successive program control circuit 200 is notified of the program operation completion so that a subsequent program operation (of the number of successive program iterations) may be performed. Thus, the program completion signal PGMNDP may be generated after first and second write control signals are generated.

The write driver 400 is driven in response to a write enable signal WDEN. The write driver 400 is provided with the first is write control signal RESETEN and the second write control signals SETP<0:n>, and the write driver 400 provides the program current I_PGM to the memory block 500 for programming input data DATA in response to the write control signals RESETEN and SETP<0:n> and the bit line select switch control signals YSW<0:m>.

Accordingly, data may be recorded in the memory block 500 according to a level of the data DATA to be programmed. In an embodiment, the memory block 500 may be configured using memory cells in and from which data are recorded and sensed by a current driving scheme. The memory cells in and from which data are recorded and sensed by the current driving scheme include, for example, phase change memory cells, and magnetic memory cells.

The successive program control circuit 200 uses the program completion signal PGMNDP as a clock signal BPCNTCK (see FIG. 9), and the successive program control circuit 200 determines the number of successive program times according to the program address CA<0> and the data count signals DC<1:x>. Further, the successive program control circuit 200 counts the number of successive program times and generates the successive programming enable signal BPGMP each time counting is implemented. If a final successive program operation is performed, the successive program control circuit 200 generates the successive program end signal DCMIN.

In general, in a semiconductor memory apparatus, the length of data to be simultaneously programmed in the buffered is program operation or the buffered overwrite operation is 32 bits (2 words). A data count value is inputted in 16 bit (1 word) units. Thus, if the data count value is set as the number of successive program times, an error will occur. Accordingly, in an embodiment of the present invention, the successive program control circuit 200 determines the number of successive program times according to the lowermost column address CA<0> and the lowermost data count signal DC<1>.

For example, when the lowermost column address CA<0> is even and the lowermost data count signal DC<1> is even, the number of successive program times DC<2:x–1> is reduced by 1. Conversely, when the lowermost column address CA<0> is even and the lowermost data count signal DC<1> is odd, or the lowermost column address CA<0> is odd and the lowermost data count signal DC<1> is even, or the lowermost column address CA<0> is odd and the lowermost data count signal DC<1> is odd, the number of successive program times DC<2:x–1> is maintained as it is.

Meanwhile, although the successive program control circuit 200 is shown independently of the program pulse generation block 100 in FIG. 7, it is conceivable that the successive program control circuit 200 is configured to be included in the program pulse generation block 100. That is to say, in some embodiments, the program pulse generation block 100 may include the successive program control circuit 200.

Figure 8:
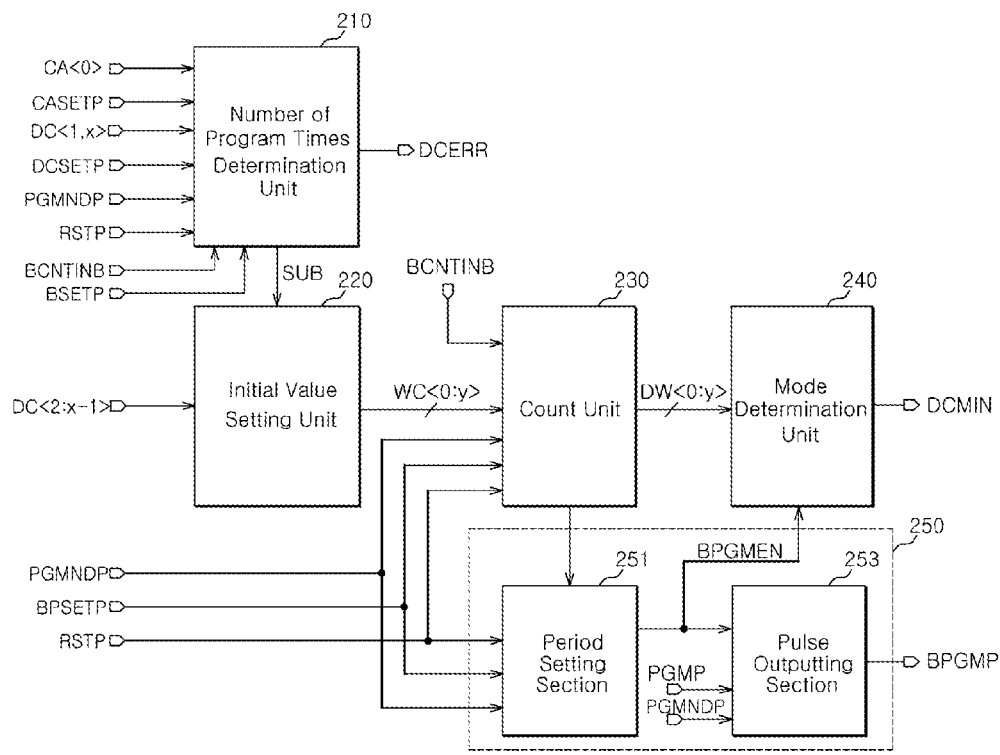
FIG. 8 is a configuration diagram of a successive program control circuit in accordance with an embodiment of the present invention.
Figure 9:
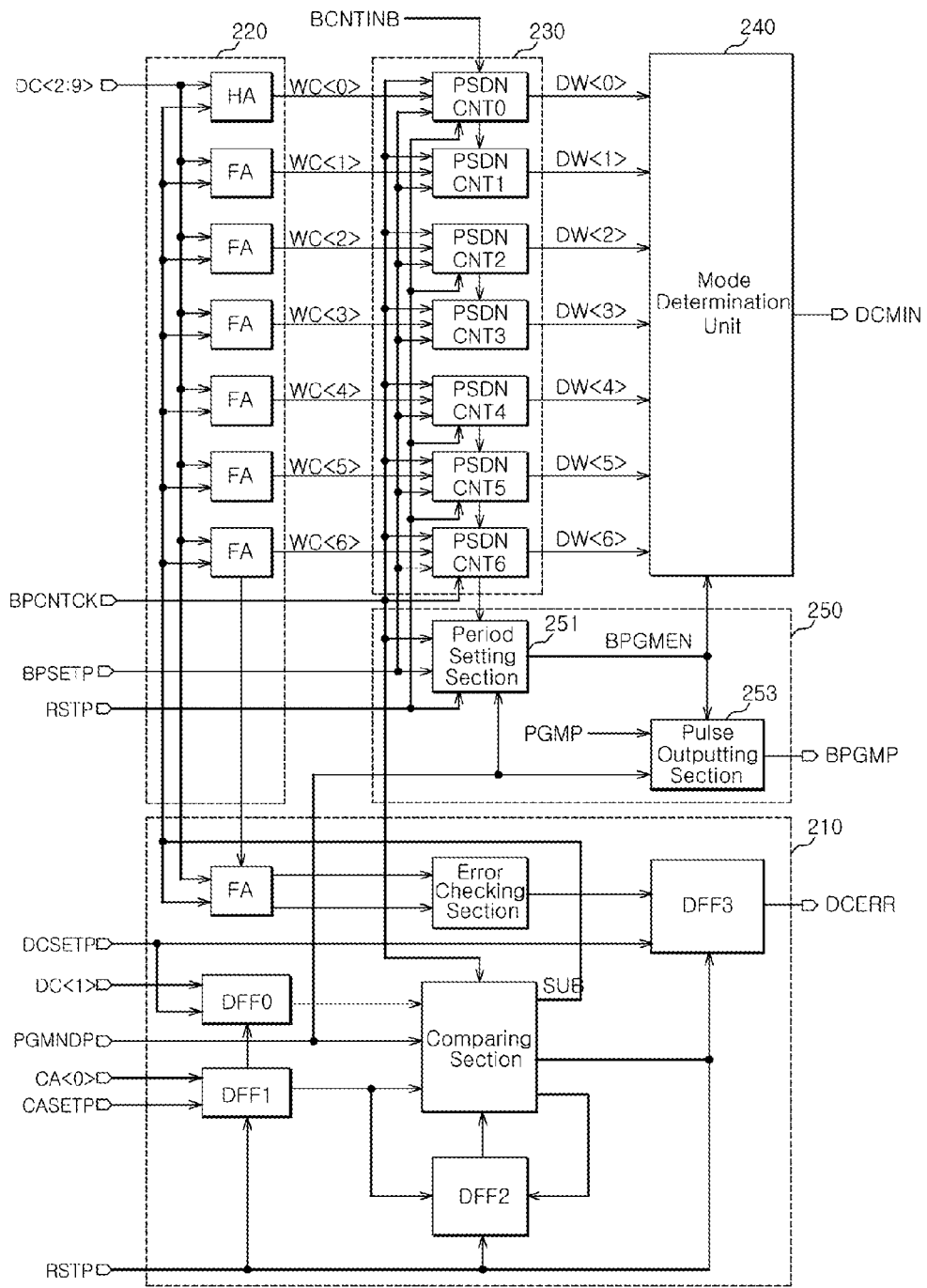
FIG. 9 is a view exemplifying the successive program control circuit shown in FIG. 8.

FIG. 8 is a configuration diagram of the successive is program control circuit in accordance with an embodiment of the present invention, and FIG. 9 is a view exemplifying the successive program control circuit shown in FIG. 8.

Referring to FIGS. 8 and 9, the successive program control circuit 200 may be configured to include a number of program times determination unit 210, an initial value setting unit 220, a count unit 230, a mode determination unit 240, and a successive program pulse generation unit 250.

The number of program times determination unit 210 is configured to determine the number of successive program times in response to the program address CA<0>, an address setting signal CASETP, the data count signals DC<1,x>, a data setting signal DCSETP, a count enable signal BCNTINB, a set signal BPSETP and a reset signal RSTP which are provided from the controller 300.

To this end, the number of program times determination unit 210 compares the levels of the program address CA<0> inputted as the lowermost column address and the lowermost data count signal DC<1>, and outputs a determination signal SUB. For example, the program address CA<0> may be set to have a high level when it is odd and a low level when it is even. The lowermost data count signal DC<1> may be set to have a high level when it is odd and a low level when it is even. Accordingly, the number of program times determination unit 210 reduces the data count signals DC<2:x–1> by 1 when both the program address CA<0> and the data count signal DC<1> have low levels, and maintains the data count signals DC<2:x–1> as they are when either the program address CA<0> or the data count signal DC<1> have high levels.

When the data count signals DC<1:9> are inputted a number of times that exceeds a maximum number of successive program times, the number of program times determination unit 210 outputs the error signal DCERR.

Referring to FIG. 9, the number of program times determination unit 210 may include a first register DFF0 which latches the lowermost data count signal DC<1> according to the data setting signal DCSETP, a second register DFF1 which latches the program address CA<0> according to the address setting signal CASETP, a comparing section configured to compare the output signals of the first and second registers DFF0 and DFF1 and output the determination signal SUB, and a third register DFF2 configured to latch again the output signal of the second register DFF1.

The third register DFF2 may detect the program address CA<0> when the level of the program address CA<0> is high, that is, a program start address is odd. If the clock signal BPCNTCK is inputted, the output of the comparing section is latched once again by the third register DFF2 so that the number of successive program times can be correctly set.

The number of program times determination unit 210 may further include adders FA configured to determine whether the levels of input signals are all high in response to the determination signal SUB, the uppermost data count signal DC<0> and the uppermost operation signal of the initial value setting unit 220. The adders FA may output sums and carry signals, and an error checking section may be configured to combine the output signals of the adders FA. A latching section DFF3 may be configured to output the error signal DCERR in response to the data setting signal DCSETP. Due to such a configuration, when the data count signals DC<1:9> are inputted a number of times that exceeds a maximum number of successive program times, the number of program times determination unit 210 outputs the error signal DCERR.

Next, the initial value setting unit 220 is configured to set the number of successive program times in response to the data count signals DC<2:x−1> and the determination signal SUB, accordingly generate initial count values WC<0:y> and generates the initial count values WC<0:y> to the count unit 230. To this end, the initial value setting unit 220 may be configured to comprise the type of adders which operate on the data count signals DC<2:x−1> and the determination signal SUB.

FIG. 9 shows an example in which the initial value setting unit 220 is configured to half adders HA and a plurality of full adders FA. Operations of the adders will be described later.

The count unit 230 performs a counting when operating in response to the count enable signal BCNTINB, the initial count signals WC<0:y>, the program completion signal PGMNDP, the set signal BPSETP and the reset signal RSTP. In particular, the count unit 230 in accordance with an embodiment of the present invention may is be configured by, but not limited to, a programmable down counter which performs down counting from the initial count signals WC<0:y> and stops the counting operation when counting is completed to 0.

The count unit 230 provides counting signals DW<0:y> to the mode determination unit 240. The count unit 230 may generate the counting signals DW<0:y> according to the counting operation.

FIG. 9 shows an embodiment in which the count unit 230 comprises a plurality of programmable down counters. When the initial count signals WC<0:y> are inputted to the count unit 230 and the count enable signal BCNTINB is enabled to a low level, the programmable down counter is ready to operate. When the clock signal BPCNTCK generated from the program completion signal PGMNDP and the data setting signal DCSETP are enabled, the count unit 230 performs the down counting operation and outputs the counting signals DW<0:y>.

A configuration of the programmable down counter shown in FIG. 9 is illustrated in detail in FIG. 14 and operations thereof will be described later.

The successive program pulse generation unit 250 is configured to generate the successive programming enable signal BPGMP depending upon whether a program period is a successive program period. For example, if the program period is not the successive program period, the successive program pulse generation is unit 250 passes the successive programming enable signal BPGMP as the successive programming enable signal BPGMP, and if programming period is the successive program period, the successive program pulse generation unit 250 outputs the successive programming enable signal BPGMP such that the next successive program is performed.

To this end, the successive program pulse generation unit 250 may be configured to include a period setting section 251 and a pulse outputting section 253.

Referring to FIG. 9, the period setting section 251 is configured to receive as an enable signal the one output signal of a final programmable down counter constituting the count unit 230. The period setting section 251 may generate a successive period enable signal BPGMEN as a flag signal which notifies that the program period is the successive program period. The period setting section 251 may generate the successive period enable signal BPGMEN in response to the program completion signal PGMNDP, the set signal BPSETP and the reset signal RSTP. In detail, when the successive period enable signal BPGMEN is set to a high level by the set signal BPSETP, if the clock signal BPCNTCK generated is inputted, the successive period enable signal BPGMEN is reset to a low level and the period setting section notifies that the program period is the successive program period.

Furthermore, the pulse outputting section 253 is configured to output the programming enable signal PGMP or the is program completion signal PGMNDP as the successive programming enable signal BPGMP, depending upon whether the successive period enable signal BPGMEN is enabled.

That is to say, if the successive period enable signal BPGMEN is in a disabled state, that is, it is not the successive program period, the pulse outputting section 253 passes the programming enable signal PGMP as the successive programming enable signal BPGMP. Conversely, when the successive period enable signal BPGMEN is enabled, the pulse outputting section 253 outputs the program completion signal PGMNDP as the successive programming enable signal BPGMP. The successive programming enable signal BPGMP generated in this way is transferred to the program pulse generation block 100 through the controller 300 such that the write control signals are generated the predetermined number of successive program times.

The mode determination unit 240 is configured to receive the counting signals DW<0:y> from the count unit 230 and the successive period enable signal BPGMEN from the period setting section 251, and generate the successive program end signal DCMIN which signifies a period for performing final program or overwrite operations (and/or commands).

The successive program end signal DCMIN is provided to the controller, and accordingly, the program operation is ended.

In this way, in an embodiment of the present invention, if the lowermost program address CA<0> and the data count signals DC<1:x> are sequentially inputted, whether an address from which program is started is an odd address or an even address is determined depending upon the level of the lowermost program address CA<0>, and how many times the buffered program command (and/or operation) or buffered overwrite command (and/or operation) is to be performed is determined according to the lowermost data count signal DC<1>. Further, by generating the successive program end signal DCMIN (which notifies that it is a period for performing the final program or the overwrite) and the successive period enable signal BPGMEN (which notifies that it is a successive program period), the buffered program/overwrite may be performed the predetermined number of times (successive program times) during a period in which the successive program is performed.

Figure 10:
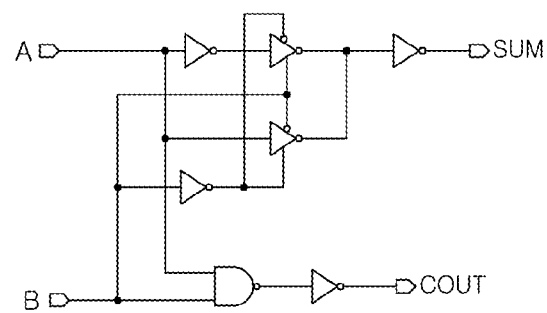
FIG. 10 is a view exemplifying a half adder which may be applied to FIG. 9.

FIG. 10 is a view exemplifying a half adder which may be applied to FIG. 9.

Referring to FIG. 10, a half adder HA may be configured as a 2-input 2-output half adder.

A first output signal SUM is generated through an XORing operation of two input signals A and B, and a second output signal COUT is generated through an ANDing operation of the two input signals A and B.

Accordingly, the first output signal SUM is enabled to a high level only when the input signals A and B exclusively include signals with logic high levels. Also, the second output signal COUT means carry or overflow.

In a logic operation, the half adder HA shown in FIG. 10 performs a function of performing an operation for the lowermost bit. When such a half adder is applied to FIG. 9, the two input signals A and B become the determination signal SUB and the data count signal DC respectively. The first output signal becomes the initial count signal WC, and the second output signal may serve as an enable signal for operating an adder of a next stage.

Figure 11:
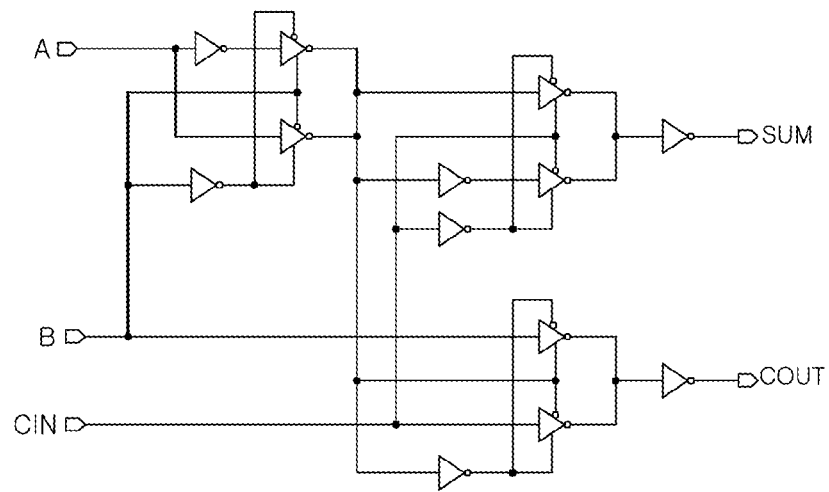
FIG. 11 is a view exemplifying a full adder which may be applied to FIG. 9.

FIG. 11 is a view exemplifying a full adder which may be applied to FIG. 9.

FIG. 11 shows a 3-input 2-output full adder FA. One of input signals A, B and CIN is a signal which is outputted from an adder of a previous stage, and in an embodiment, the second output signal COUT shown in FIG. 10 may the input signal CIN shown in FIG. 11.

When the three input signals A, B and CIN include 1 exclusively from one another, that is, only any one input signal has a high level, a first output signal SUM of a high level is generated. When at least two of the input signals A, B and CIN have high levels, a second output signal COUT is outputted at a high level. Moreover, the second output signal COUT is provided as an input signal to a full adder FA of a next stage.

In a logic operation, such a full adder FA may be applied to an operation for bits excluding the lowermost bit.

Figure 12:
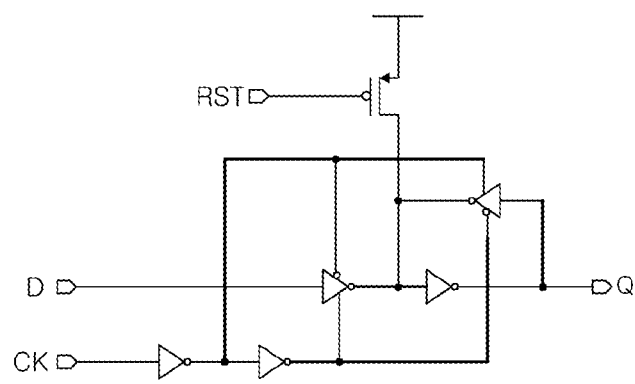
FIG. 12 is a view exemplifying a D flip-flop which may be applied to FIG. 9.

FIG. 12 is a view exemplifying a D flip-flop which may be applied to FIG. 9.

The D flip-flop shown in FIG. 12 may be applied to the first to fourth registers DFF0 to DFF3 shown in FIG. 9.

As can be seen from FIG. 12, the D flip-flop functions to transfer input data D to a node Q at the rising edge of a clock signal CK, and latch the input data D at the falling edge of the clock signal CK and maintain the data D at the node Q.

When a D flip-flop is applied to the registers shown in FIG. 9, the data setting signal DCSETP, the address setting signal CASETP and the output signal of the comparing section may be provided as clock pulses.

Figure 13:
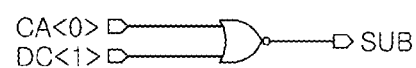
FIG. 13 is a view exemplifying a comparing section which may be applied to FIG. 9.

FIG. 13 is a view exemplifying a comparing section which may be applied to FIG. 9.

As described above, the comparing section compares the lowermost data count signal DC<1> and the program address CA<0> and generates the determination signal SUB. In particular, except for the case in which both the lowermost data count signal DC<1> and the program address CA<0> have logic levels indicating even numbers, the comparing section enables the determination signal SUB.

To this end, the comparing section may be configured to include a NOR operation element as shown in FIG. 13.

Figure 14:
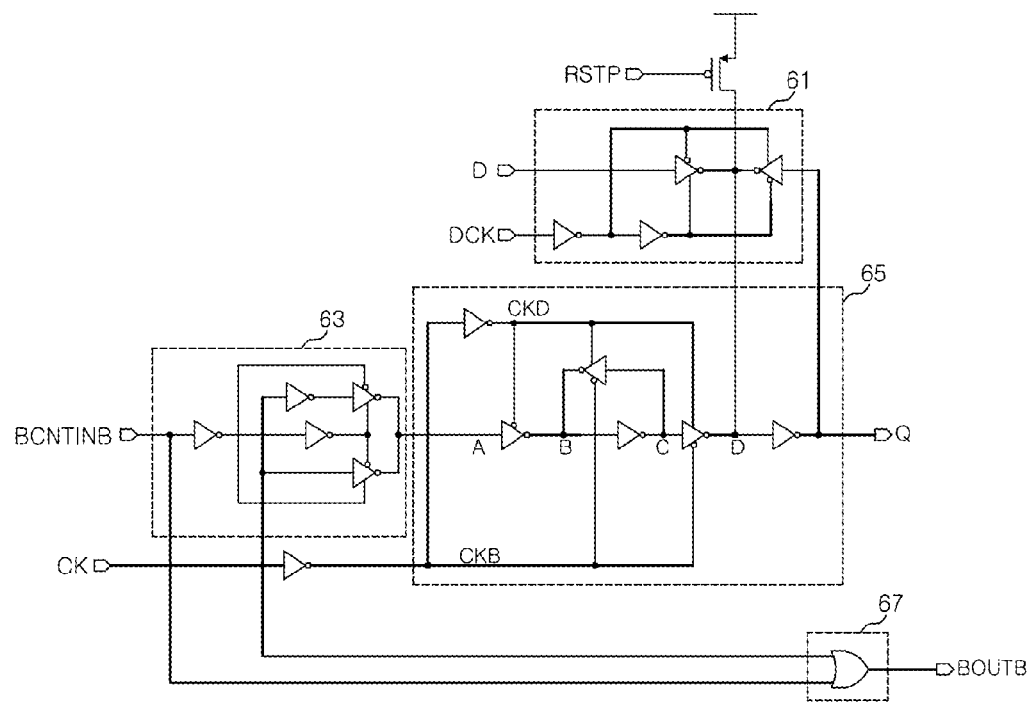
FIG. 14 is a view exemplifying a counter which may be applied to a count unit shown in FIG. 9.

FIG. 14 is a view exemplifying a counter which may be applied to the count unit shown in FIG. 9.

A counter which may be applied as the count unit 230 is a counter which performs an operation from an initial setting value, is that is, a pre-settable down counter or a programmable down counter.

Referring to FIG. 14, a counter may include a data resetting section 61, a signal inputting section 63, a latching section 65, and a borrow generating section 67.

The data resetting section 61 is configured to receive data D to be stored and transfer the data D to an output node Q through a node D as a clock signal DCK toggles from a high level to a low level. The data of the output node Q is fed back to the data resetting section 61 and data is maintained in the output node Q.

While the count enable signal BCNTINB maintains a high level in the signal inputting section 63, the latching section 65 only maintains a previous data value and does not operate even when the clock signal CK is provided. If the count enable signal BCNTINB is inputted at a low level, the latching section 65 operates.

Depending upon at which level the count enable signal BCNTINB is inputted, whether to buffer or invert the data of the output node Q in the signal inputting section 63 is determined. When the latching section 65 operates, that is, the count enable signal BCNTINB is the low level, the data level of the output node Q is inverted, and when the count enable signal BCNTINB is the high level, the data of the output node Q is buffered.

Accordingly, when the latching section 65 can operate, that is, when the count enable signal BCNTINB has the low level, the data of the output node Q is inverted and outputted to a node A. If the clock signal CK becomes a low level, the data of the node A is is inverted and transferred to a node B, and is then inverted again and transferred to a node C. If the clock signal CK becomes a high level, the data level is maintained as it is. At this time, the data of the node C is transferred to a node D, and is then inverted and transferred to the node Q, as a result of which data having an opposite phase to a previous data level is outputted to the output node Q.

Therefore, it can be seen that the counter shown in FIG. 14 operates the latching section 65 when the count enable signal BCNTINB has the low level and serves as a down counter.

If the reset signal RSTP is enabled, even though the output node Q maintains the high level, the output node Q is forcibly reset to the low level, by which the operation of the counter is ended.

The borrow generating section 67 is configured to enable a borrow signal BOUTB when both the count enable signal BCNTINB and the output node Q have the low levels. The borrow signal BOUTB serves as an enable signal which enables a next stage counter to perform a down counting operation.

Figure 15:
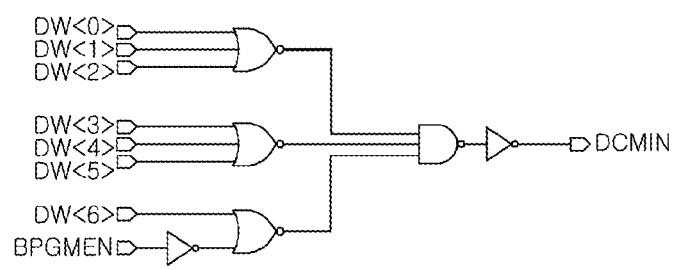
FIG. 15 is a view exemplifying a mode determination unit shown in FIG. 9.

FIG. 15 is a view exemplifying the mode determination unit shown in FIG. 9.

The mode determination unit 240 checks whether a counting operation for successive program operation is completed, that is, whether or not a final counting operation is performed, depending upon levels of the counting signals DW<0:y> while the successive period enable signal BPGMEN is enabled, and the mode is determination unit 240 outputs the successive program end signal DCMIN.

FIG. 15 shows the case of detecting a period in which all the levels of the counting signals DW<0:y> are low while the successive period enable signal BPGMEN is enabled to a high level and outputting the successive program end signal DCMIN. As aforementioned, the successive program end signal DCMIN is provided to the controller and indicates that current write control signals are final write control signals.

Figure 16:
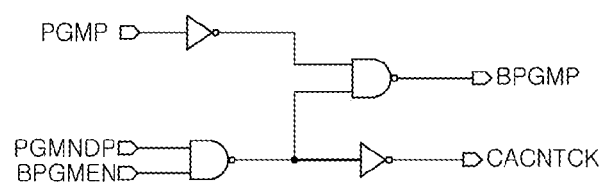
FIG. 16 is a view exemplifying a pulse outputting section shown in FIG. 9.

FIG. 16 is a view exemplifying the pulse outputting section shown in FIG. 9.

The pulse outputting section 253 generates an address count clock CACNTCK according to the levels of the successive period enable signal BPGMEN and the program completion signal PGMNDP, and the pulse outputting section 253 generates the successive programming enable signal BPGMP by combining the address count clock CACNTCK and the programming enable signal PGMP.

That is to say, if the program completion signal PGMNDP is enabled during a period in which the successive period enable signal BPGMEN is enabled, the program completion signal PGMNDP is outputted as the successive programming enable signal BPGMP. If, however, the successive period enable signal BPGMEN is disabled, that is, it is not a successive program period, the programming enable signal PGMP is passed as the successive programming enable signal BPGMP.

Figure 17:
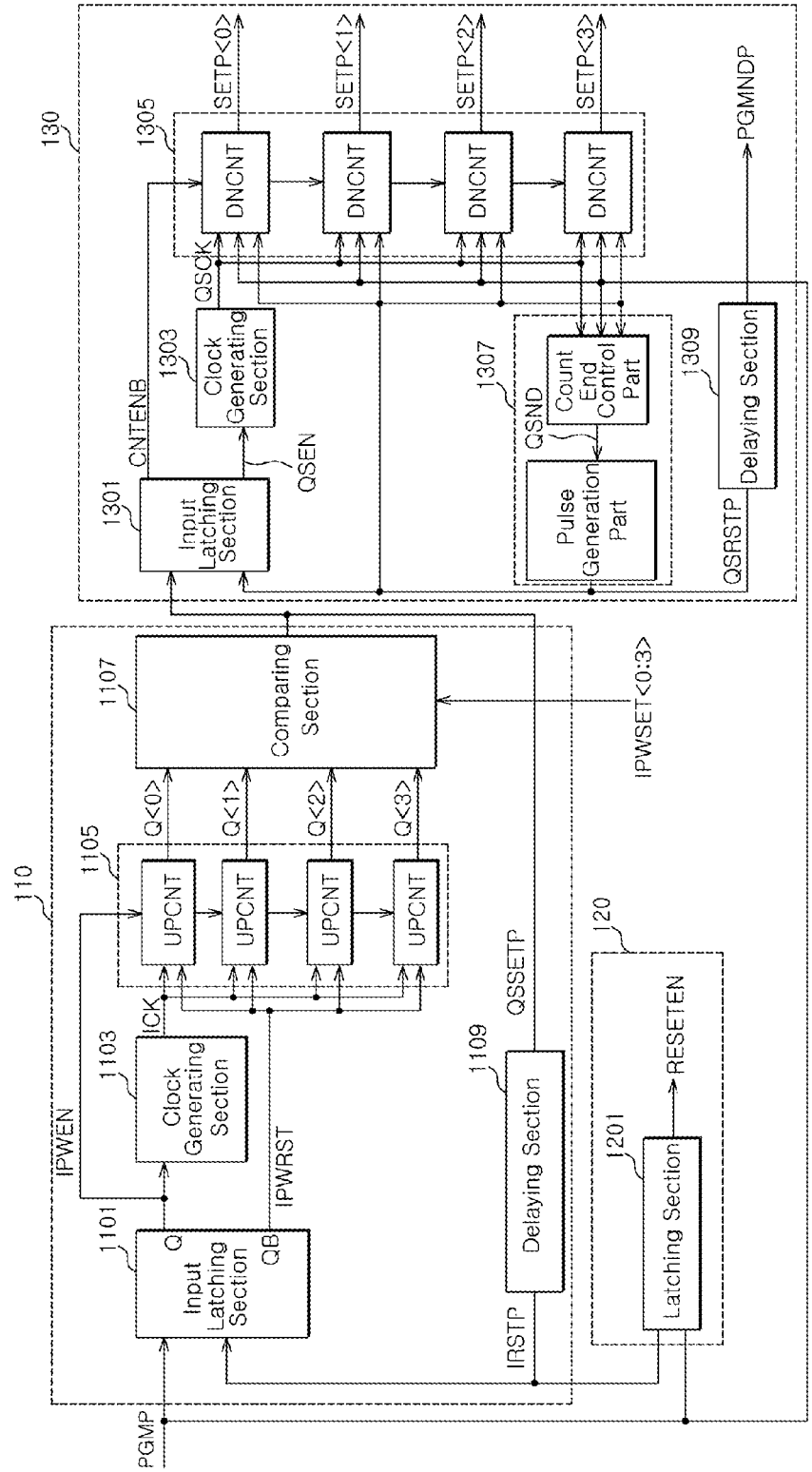
FIG. 17 is a view exemplifying a program pulse generation block.

FIG. 17 is a view exemplifying a program pulse generation block which may be applied to the present invention.

Referring to FIG. 17, the program pulse generation block 100 includes an initial pulse generation unit 110, a reset pulse generation unit 120, and a quenching pulse generation unit 130.

The initial pulse generation unit 110 is configured to generate the period setting signal QSSETP in response to the programming enable signal PGMP which is provided from the controller 300. The period setting signal QSSETP is a signal for determining a time for providing heat near a melting point to a GST. The initial pulse generation unit 110 enables the period setting signal QSSETP after counting a predetermined time interval in response to the programming enable signal PGMP.

The reset pulse generation unit 120 is configured to generate the first write control signal RESETEN in response to the programming enable signal PGMP and the reset signal IRSTP which is generated by delaying the period setting signal QSSETP by a predefined time interval.

The quenching pulse generation unit 130 is configured to generate the second write control signals SETP<0:n> which have different enable periods, in response to the programming enable signal PGMP and the period setting signal QSSETP. When the generation of the second write control signals SETP<0:n> is completed, the quenching pulse generation unit 130 generates the program completion signal PGMNDP.

According to the configuration as described above, the reset pulse generation unit 120 generates the first write control signal RESETEN during a period from after the programming enable signal PGMP is enabled to until the reset signal IRSTP is enabled. The quenching pulse generation unit 130 enables the second write control signals SETP<0:n> at the same levels from after the programming enable signal PGMP is enabled to until the period setting signal QSSETP is enabled, and generates the second write control signals SETP<0:n> which are controlled in the enable periods thereof, after the period setting signal QSSETP is generated.

Detailed descriptions will be given below.

First, the initial pulse generation unit 110 includes an input latching section 1101, a clock generating section 1103, a first counting section 1105, a comparing section 1107, and a delaying section 1109.

The input latching section 1101 is configured to output the internal clock enable signal IPWEN and a count reset signal IPWRST in response to the programming enable signal PGMP and the reset signal IRSTP. That is to say, if the programming enable signal PGMP is enabled, for example, to a high level, the internal clock enable signal IPWEN is activated to a high level, and if the reset signal IRSTP is enabled to a high level, the count reset signal IPWRST is activated to a high level.

In detail, the input latching section 1101 may be configured such that the internal clock enable signal IPWEN is enabled to the high level and the count reset signal IPWRST is enabled to a low level. The input latching section 1101 may be configured using an R-S latch constituted by a NAND gate or a NOR gate, or a flip-flop.

The clock generating section 1103 is configured to generate an internal clock ICK in response to the internal clock enable signal IPWEN. In other words, the clock generating section 1103 outputs the internal clock ICK which toggles while the internal clock enable signal IPWEN is activated to the high level.

The first counting section 1105 is configured to output counting codes Q<0:3> which are counted according to control of the internal clock enable signal IPWEN, the count reset signal IPWRST and the internal clock ICK. Namely, the first counting section 1105 performs a counting operation according to control of the internal clock ICK when the internal clock enable signal IPWEN is activated to the high level. If the count reset signal IPWRST is activated to the high level, the counting codes Q<0:3> outputted from the first counting section 1105 are initialized. In this way, as the counting codes Q<0:3> are generated using the first counting section 1105, a circuit size may be significantly reduced. The first counting section 1105 may be configured by up counters.

The comparing section 1107 is configured to activate and output the period setting signal QSSETP when the counting codes Q<0:3> reach a preset value. In detail, the comparing section 1107 is configured to compare the counting codes Q<0:3> with time control codes IPWSET<0:3> applied, and the comparing section 1107 is configured to activate the period setting signal QSSETP when the counting codes Q<0:3> are the same as the time control codes IPWSET<0:3>. That is to say, the activation timing of the period setting signal QSSETP may be controlled by controlling the time control codes IPWSET<0:3>.

In an embodiment of the present invention, the generation timing of the period setting signal QSSETP may be delayed by simultaneously increasing the number of counters constituting the first counting section 1105 and the number of time control codes IPWSET. This means that a time required for melting the GST constituting a memory cell may be changed.

The delaying section 1109 is configured to delay the period setting signal QSSETP by the predetermined time interval and output the reset signal IRSTP. The delay value of the delaying section 1109 is set to satisfy a prescribed timing margin. The reset signal IRSTP generated by the delaying section 1109 resets the input latching section 1101 and disables the internal clock enable signal IPWEN, and enables the count reset signal IPWRST such that the clock generating section 1103 and the first counting section 1105 are disabled.

The reset pulse generation unit 120 is enabled by the programming enable signal PGMP and is disabled by the period setting signal QSSETP. In other words, the reset pulse generation unit 120 generates the first write control signal RESETEN for the time set by the time control codes IPWSET<0:3>, and provides the first write control signal RESETEN to the write driver 400.

Next, the quenching pulse generation unit 130 may be configured to include an input latching section 1301, a clock generating section 1303, a second counting section 1305, a reset controlling section 1307, and a delaying section 1309.

The input latching section 1301 is configured to output the count enable signal CNTENB and the internal clock enable signal QSEN in response to the period setting signal QSSETP and the reset signal QSRSTP. The clock generating section 1303 is configured to generate an internal clock QSCK in response to an internal clock enable signal QSEN. Namely, the clock generating section 1303 outputs the internal clock QSCK which toggles while the internal clock enable signal QSEN is activated to a high level.

The second counting section 1305 is configured to output the second write control signals SETP<0:3> in response to a count enable signal CNTENB, the internal clock QSCK, the programming enable signal PGMP and a reset signal QSRSTP. Accordingly, the update cycle of the second write control signals SETP<0:3> is controlled in correspondence to the toggling cycle of the internal clock QSCK.

In an embodiment of the present invention, the second counting section 1305 may be configured to include down counters. In this case, the second counting section 1305 operates while a final output is changed from 0x1111b to 0x0000b. If the final output is becomes 0x0000b, the output signal of the second write control signal SETP<3> drives the reset controlling section 1307.

The reset controlling section 1307 is configured to enable the reset signal QSRSTP when the code value of the second write control signals SETP<0:3> outputted from the second counting section 1305 reaches a predetermined value, that is, when the output signal of the second write control signal SETP<3> transitions from a high level to a low level.

To this end, the reset controlling section 1307 may include a count end control part and a pulse generation part. The count end control part generates a quenching pulse completion signal QSND as counting of the second counting section 1305 is completed, and the pulse generation part generates the reset signal QSRSTP in response to the quenching pulse completion signal QSND. For example, the quenching pulse completion signal QSND outputted from the count end control part maintains a high level by the programming enable signal PGMP, and transitions to a low level when the second write control signals SETP<3> becomes the low level. The pulse generation part enables the reset signal QSRSTP by the quenching pulse completion signal QSND transitioned to the low level.

The delaying section 1309 is configured to delay the reset signal QSRSTP by a preselected time and generates the program completion signal PGMNDP. The program completion signal PGMNDP is transmitted to the controller 300 and indicates that the program is completed.

Figure 18:
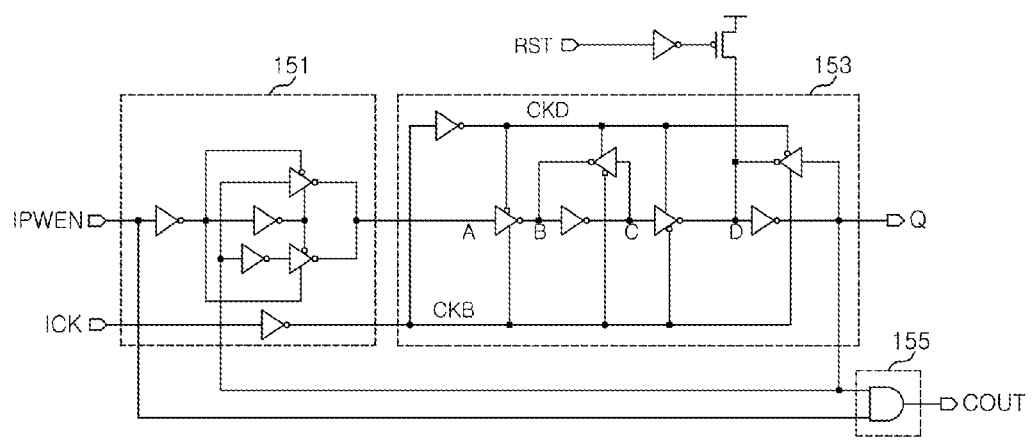
FIG. 18 is an exemplary view explaining a configuration of a first counting section shown in FIG. 17.

FIG. 18 is an exemplary view illustrating a configuration of the first counting section shown in FIG. 17.

In an embodiment of the present invention, the first counting section 1105 may be configured using a plurality of 1-bit up counters, and FIG. 18 shows an example of an up counter.

Referring to FIG. 18, a 1-bit up counter 150 may include a signal input part 151, a latch part 153, and a carry generation part 155.

The signal input part 151 is configured to determine the level of the signal of an input node A of the latch part 153 in response to a count enable signal, that is, the internal clock enable signal IPWEN and the first counting code Q<0> in an embodiment of the present invention.

The latch part 153 is configured to latch the signal outputted from the signal input part 151 according to the control of the internal clock ICK and output the first counting code Q<0>. The carry generation part 155 is configured to output a carry signal COUT according to the internal clock enable signal IPWEN and the first counting code Q<0>. The carry signal COUT is used as a count enable signal of a next stage 1-bit up counter. The internal node of the latch part 153 is initialized or is changed to a specified level in response to the count reset signal IPWRST.

In detail, the signal input part 151 selects the resultant value of an output node Q when when the internal clock enable signal IPWEN is disabled to a low level, and oppositely selects the resultant is value of the output node Q and transfers the oppositely selected resultant value to the next stage 1-bit up counter when the internal clock enable signal IPWEN is enabled to the high level.

The latch part 153 transfers the signal of the node A to a node C when the signal of the node A is a low level, and transfers the signal of the node A to the output node Q when the signal of the node A is a high level.

If the count reset signal IPWRST becomes the high level, the output node Q is reset to a low level, and the carry generation part 155 operates according to the signal applied to the output node Q of a previous stage 1-bit up counter, which serves as a count enable signal. That is to say, according to the signal level of the signal applied to the output node Q of a previous stage 1-bit up counter, a next stage 1-bit up counter toggles.

Figure 19:
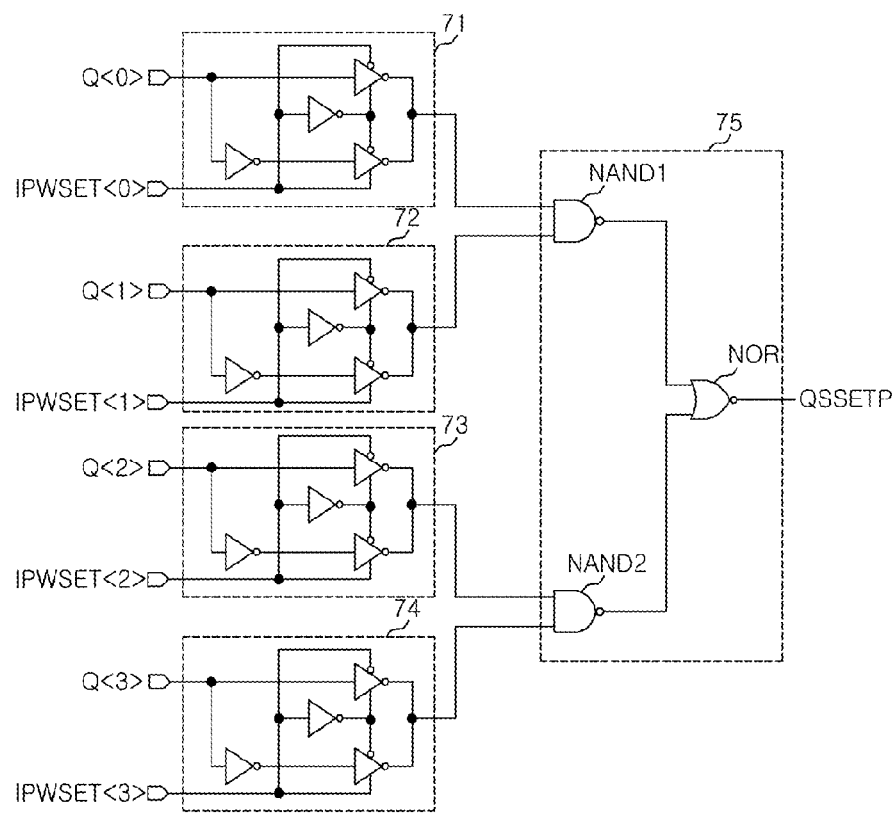
FIG. 19 is a view exemplifying the comparing section shown in FIG. 17.

FIG. 19 is a view exemplifying the comparing section shown in FIG. 17.

Referring to FIG. 19, the comparing section 1107 may include a plurality of comparison parts 71, 72, 73 and 74 and a signal combination part 75. The plurality of comparison parts 71, 72, 73 and 74 are configured to compare respective bit values of the counting codes Q<0:3> and the time control codes IPWSET<0:3> and output a plurality of comparison result signals. The signal combination part 75 is configured to combine the plurality of comparison result signals outputted from the plurality of comparison parts 71, 72, 73 and 74, and output the period setting signal QSSETP. In other words, in an embodiment, the comparing section 1107 activates and outputs the period setting signal QSSETP when the counting codes Q<0:3> and the time control codes IPWSET<0:3> are the same with each other.

Figure 20:
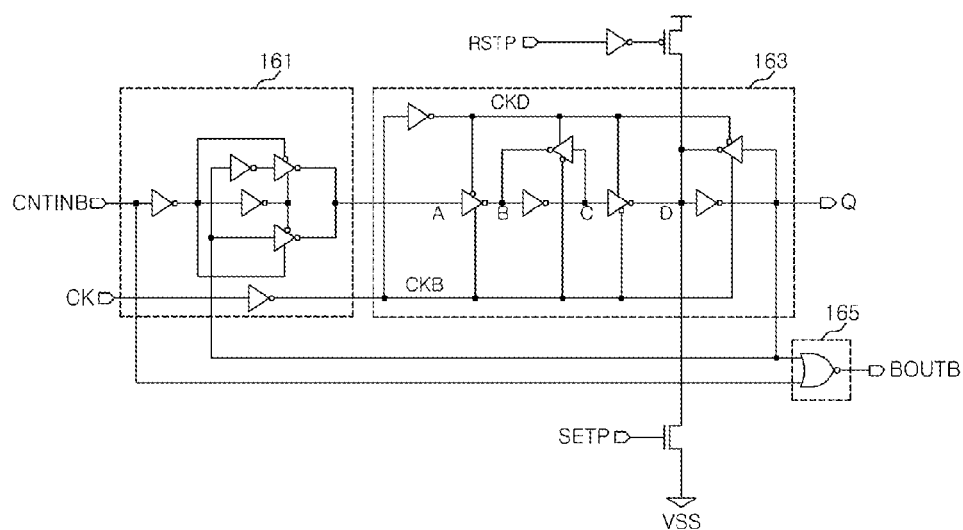
FIG. 20 is a view for explaining configurations of a period setting section shown in FIG. 9 and a second counting section shown in FIG. 17.

FIG. 20 is a view for explaining configurations of the period setting section shown in FIG. 9 and the second counting section shown in FIG. 17.

In an embodiment of the present invention, the period setting section 251 shown in FIG. 9 may be configured using a down counter, for example, a 1-bit down counter.

Referring to FIG. 20, the 1-bit down counter 160 may include a signal input part 161, a latch part 163, and a borrow generation part 165.

The signal input part 161 is configured to determine the level of the signal of an input node A of the latch part 163 according to a count enable signal CNTINB and the level of the data applied to an output node Q.

The latch part 163 is configured to latch the signal outputted from the signal input part 161 according to the control of the clock signal CK (BPCNTCK in the case of FIG. 9), and transfer the latched data to the output node Q.

The borrow generation part 165 is configured to output a borrow signal BOUTB according to the count enable signal CNTINB and the level of the signal applied to the output node Q.

The internal node of the latch part 163 is initialized or is is changed to a specified level in response to the reset signal RSTP and a set signal SETP (BPSETP in the case of FIG. 9).

In detail, the signal input part 161 selects the resultant value of the output node Q when the count enable signal CNTINB is disabled to a high level, and oppositely selects the resultant value of the output node Q and transfers the oppositely selected resultant value to a next stage when the count enable signal CNTINB is enabled to a low level.

The signal selected by the signal input part 161 is applied to the node A. Accordingly, the latch part 163 transfers the signal of the node A to a node C when the signal of the node A is a low level, and transfers the signal of the node A to the output node Q when the signal of the node A is a high level.

If the set signal SETP becomes a high level, the output node Q is set to a high level. If the reset signal RSTP becomes a high level, the output node Q is reset to a low level.

The borrow generation part 165 outputs the borrow signal BOUTB of a low level when the output node Q of a previous stage counter becomes a low level.

Figure 21:
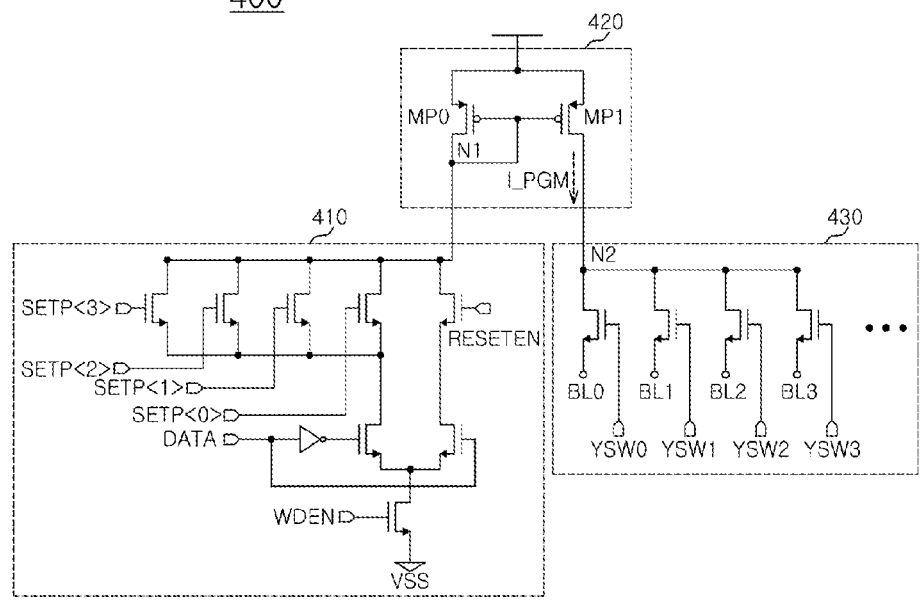
FIG. 21 is a view exemplifying a write driver which may be applied to an embodiment of the present invention.

FIG. 21 is a view exemplifying a write driver which may be applied to the present invention.

Referring to FIG. 21, the write driver 400 may include a current controlling section 410, a current driving section 420, and a selecting section 430.

The current controlling section 410 is configured to is receive the data DATA to be programmed, and control the voltage level of a control node N1 according to a code combination of the first write control signal RESETEN and the second write control signals SETP<0:3> when the write enable signal WDEN is activated. A plurality of NMOS transistors, which are controlled by the second write control signals SETP<0:3>, are selectively turned on and control the voltage level of the control node N1. An NMOS transistor, which is controlled by the first write control signal RESETEN, is turned on when the first write control signal RESETEN is activated and controls the voltage level of the control node N1.

The second write control signals SETP<0:3> are signals which are cyclically updated, and the first write control signal RESETEN is a signal which is inputted in the form of a pulse.

The current driving section 420 is configured to drive the programming current pulse I_PGM may have a magnitude corresponding to the voltage level of the control node N1. The current driving section 420 may drive the current pulse I_PGM to an output node N2. The programming current pulse I_PGM may be divided into a first programming current pulse which corresponds to the first write control signal RESETEN and a second programming current pulse which corresponds to the second write control signals SETP<0:3>.

The selecting section 430 is configured to output the programming current pulse I_PGM driven by the current driving section 420 to bit lines BL0 to BLm corresponding to the plurality of bit line select switch control signals YSW<0:m>.

Figure 22:
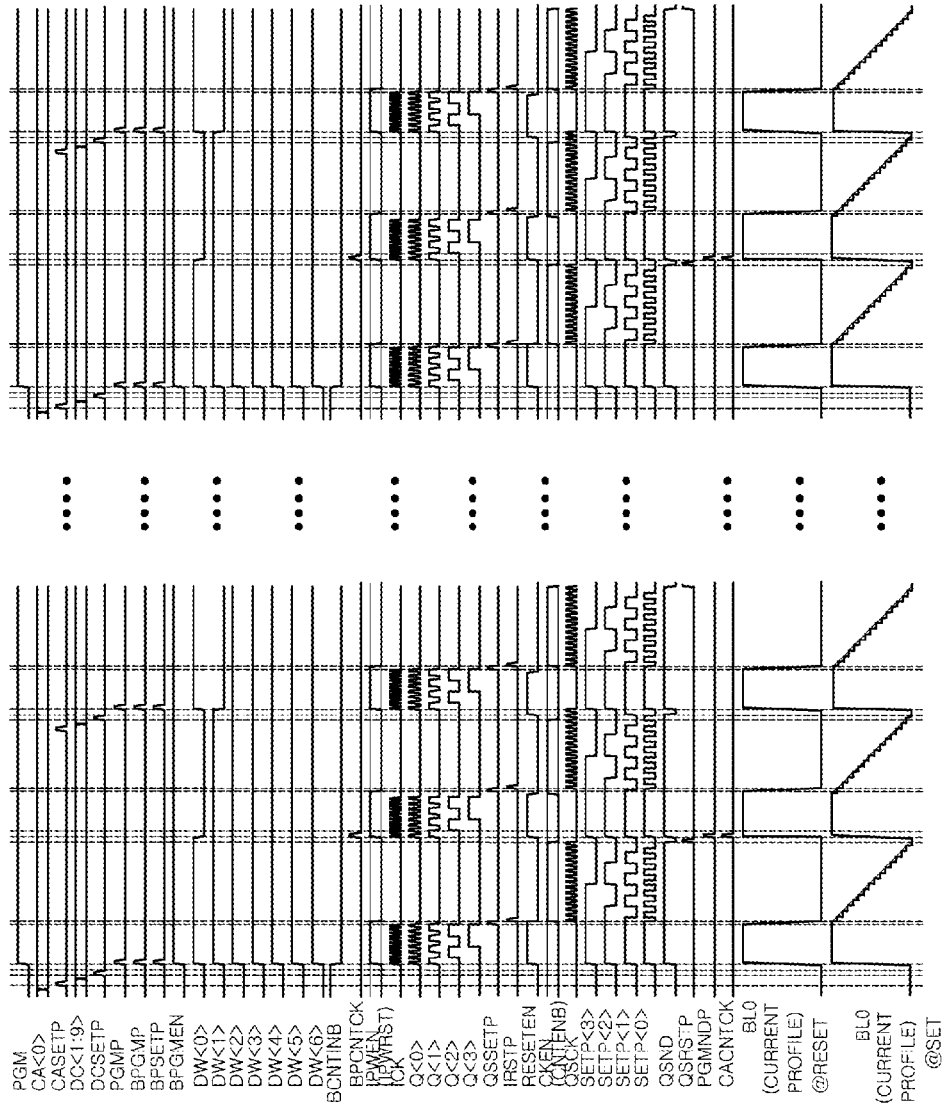
FIG. 22 is a timing diagram explaining successive program operations in accordance with an embodiment of the present invention.

FIG. 22 is a timing diagram explaining successive program operations in accordance with an embodiment of the present invention. FIG. 22 shows the case of performing the buffered overwrite and will be described with reference back to FIG. 9.

Before the program operation is started, the program address CA<0>, the address setting signal CASETP, the data count signals DC<1:9> and the data setting signal DCSETP are inputted in advance and are stored in registers.

Thereafter, as a program command PGM is applied, the programming enable signal PGMP and the set signal BPSETP are generated from the controller 300, and the successive program pulse generation unit 250 transfers the programming enable signal PGMP unmodified, as the successive programming enable signal BPGMP. The period setting section 251 of the successive program pulse generation unit 250 enables the successive period enable signal BPGMEN.

The count unit 230 is driven according to the count enable signal BCNTINB, down-counts the initial count signals WC<0:y> set by the initial value setting unit 220, and outputs the counting signals DW<0:y>.

In an initial program operation, the successive program pulse generation unit 230 passes the programming enable signal PGMP, and by the first and second write control signals RESETEN and SETP<0:3> which are resultantly generated, the buffered overwrite of an initial time is performed.

That is to say, the internal clock enable signal IPWEN is generated from the initial pulse generation unit 110 of the program pulse generation block 100. After the internal clock ICK is generated from the internal clock enable signal IPWEN, the counting codes Q<0:3> are generated by counting the predetermined time, and the period setting signal QSSETP is generated when the counting is completed.

The reset pulse generation unit 120 enables the first write control signal RESETEN in response to the programming enable signal PGMP, and, as the reset signal IRSTP generated by delaying the period setting signal QSSETP by the predefined time is enabled, disables the first write control signal RESETEN. During the period in which the first write control signal RESETEN is enabled, the programming current is generated from the write driver 400 and is provided to the bit line BL0.

The quenching pulse generation unit 130 generates the count enable signal CKEN (CNTENB) and the internal clock QSCK in response to the period setting signal QSSETP. Further, accordingly, the quenching pulse generation unit 130 generates the second write control signals SETP<0:3> which have different enable periods. If generation of the second write control signals SETP<0:3> is completed, the quenching pulse completion signal QSND is disabled, and, as the reset signal QSRSTP is enabled accordingly, the program completion signal PGMNDP is outputted. In this case, as the current driving force of the write driver 400 is sequentially damped according is to the enable periods of the second write control signals SETP<0:3>, a quenching pulse is provided to a memory cell.

The program completion signal PGMNDP generated after the initial time program operation is provided to the successive program control circuit 200. Thereafter, the program completion signal PGMNDP is outputted as the successive programming enable signal BPGMP each time the count unit 230 down-counts an initial value to 0 such that the program operation is performed by the predetermined number of successive program times.

As a consequence, since data of 2 to 256 words (4 to 512 bytes) can be simultaneously recorded, it is possible to improve the efficiency of the buffered program or the buffered overwrite.

While certain embodiments have been described above, it will be understood to those skilled in the art that the embodiments described are by way of example only. Accordingly, the semiconductor memory apparatus, and the successive program control circuit and the program method therefor described herein should not be limited based on the described embodiments. Rather, the semiconductor memory apparatus, and the successive program control circuit and the program method therefor described herein should only be limited in light of the claims that follow when taken in conjunction with the above description and accompanying drawings.

What is claimed is:

1. A semiconductor memory apparatus comprising:
    a program pulse generation block configured to generate write control signals and a program completion signal in response to a programming enable signal;
    a successive program control circuit configured to generate a successive programming enable signal in response to received program addresses and data count signals as a buffered program command or a buffered overwrite command; and
    a controller configured to generate the programming enable signal in response to the successive programming enable signal.

2. The semiconductor memory apparatus according to claim 1,
    wherein the controller generates the programming enable signal each time the successive programming enable signal is enabled, and wherein the program pulse generation block generates the write control signals each time the programming enable signal is enabled, and generates the program completion signal when an operation for generating the write control signals is completed.

3. The semiconductor memory apparatus according to claim 1, wherein the successive program control circuit sets a number of successive program times according to the program addresses and the data count signals.

4. The semiconductor memory apparatus according to claim 3, wherein the successive program control circuit sets the number of successive program times, depending upon whether a lowermost column address of the program addresses is even or odd and whether a number of words of data to be programmed, which is determined from the data count signals, is even or odd.

5. The semiconductor memory apparatus according to claim 3, wherein the successive program control circuit generates the successive programming enable signal through a counting operation according to the number of successive program times in response to the program completion signal.

6. The semiconductor memory apparatus according to claim 3, wherein the successive program control circuit generates a successive program end signal when final successive program is performed and provides the successive program end signal to the controller.

7. The semiconductor memory apparatus according to claim 3, wherein the successive program control circuit generates an error signal when the data count signals exceed a predetermined maximum number of successive program times, and provides the error signal to the controller.

8. The semiconductor memory apparatus according to claim 1, further comprising:
a write driver configured to generate a program current corresponding to the write control signals and program data to a memory block.

9. The semiconductor memory apparatus according to claim 8,
wherein the program pulse generation bock generates the write control signals each time the successive programming enable signal is enabled, and
wherein the write driver is connected to bit lines by a preset program unit and simultaneously receives a plurality of data to be programmed, and the write driver is driven according to the program addresses and programs the data to the memory block.

10. The semiconductor memory apparatus according to claim 8, wherein the memory block includes a plurality of memory cells from which and in which data are recorded and sensed in a current driving scheme.

11. A semiconductor memory apparatus comprising:
a program pulse generation block configured to generate a successive programming enable signal in response to program addresses and data count signals, and output write control signals according to a programming enable signal which is generated in response to the successive programming enable signal; and
a write driver configured to provide a program pulse generated in response to the write control signals, to a memory block.

12. The semiconductor memory apparatus according to claim 11, wherein the successive programming enable signal is enabled in correspondence to a predetermined number of successive program times.

13. The semiconductor memory apparatus according to claim 12, wherein the program pulse generation block generates a program completion signal after the write control signals are generated, and generates the successive programming enable signal in response to the program completion signal.

14. The semiconductor memory apparatus according to claim 11, wherein the write control signals include a first write control signal for programming data of a first level and second write control signals for programming data of a second level.

15. A successive program control circuit,
wherein the successive program control circuit is connected with a program pulse generation block which generates a program completion signal in response to a programming enable signal which is generated according to a successive programming enable signal, and
wherein the successive program control circuit sets the number of successive program times according to program addresses and data count signals, and generates the successive programming enable signal according to the number of successive program times.

16. The successive program control circuit according to claim 15, wherein the successive programming enable signal is generated through a counting operation according to the number of successive is program times.

17. The successive program control circuit according to claim 15, wherein the successive program control circuit comprises:
a number of program times determination unit configured to output a determination signal on which the number of successive program times corresponds, in response to the program addresses and the data count signals;
an initial value setting unit configured to generate an initial count signal in response to the data count signals and the determination signal;
a count unit configured to receive the initial count signal, perform counting in response to the program completion signal, and generate a counting signal in each counting operation; and
a successive program pulse generation unit configured to output the successive programming enable signal during a successive program period, in response to the counting signal, the programming enable signal and the program completion signal.

18. The successive program control circuit according to claim 17, wherein the number of program times determination unit outputs the determination signal depending upon whether a lowermost column address of the program addresses is even or odd and whether a number of words of data to be programmed, which is determined from the data count signals, is even or odd.

19. The successive program control circuit according to claim 17, wherein the number of program times determination unit outputs an error signal when the data count signals exceed a predetermined maximum number of successive program times.

20. The successive program control circuit according to claim 17, wherein the count unit performs down counting from the initial count signal.

21. The successive program control circuit according to claim 17, wherein the successive program pulse generation unit comprises:
a period setting section configured to generate a successive period enable signal in response to the counting signal and the program completion signal; and
a pulse outputting section configured to select one of the programming enable signal or the program completion signal and output the successive programming enable signal, in response to the successive period enable signal.

22. The successive program control circuit according to claim 21, further comprising:
a mode determination unit configured to generate a successive program end signal in response to the counting signal and the successive period enable signal.

23. The successive program control circuit according to claim 15, wherein the successive program control circuit generates write control signals by the programming enable signal and provides the write control signals to a write driver.

24. A program method for a semiconductor memory apparatus, comprising:
inputting data to a semiconductor memory apparatus having a program pulse generation block;
determining, by the program pulse generation block, a number of successive program times according to program addresses and data count signals;
repeatedly generating a programming enable signal, by the program pulse generation block, in correspondence to the number of successive program times; and
programming the data to a selected region of a memory block by a write driver, in response to the programming enable signal.

25. The method according to claim 24,
wherein the data is programmed to the selected region of the memory block according to write control signals which are generated in response to the programming enable signal, and
wherein the method further comprises:
outputting a program completion signal by the program pulse generation block after the write control signals are generated.

26. The method according to claim 25, wherein the programming enable signal is generated according to a successive programming enable signal which is generated in response to the program completion signal.

27. The method according to claim 24, wherein repeatedly generating the programming enable signal comprises:
generating initial count signals in response to a determination signal which is generated according to the program addresses and the data count signals;
performing counting in response to the initial count signals; and
generating the programming enable signal each time the counting is performed.

28. The method according to claim 27, wherein performing the counting comprises:
performing down-counting from the initial count signals.

29. The method according to claim 24, wherein determining the number of successive program times further comprises determining the number of successive program times depending upon whether a lowermost column address of the program addresses is even or odd and whether a number of words of data to be programmed, which is determined from the data count signals, is even or odd.

* * * * *